United States Patent [19]
Seyyedy

[11] Patent Number: 5,917,746
[45] Date of Patent: Jun. 29, 1999

[54] CELL PLATE STRUCTURE FOR A FERROELECTRIC MEMORY

[75] Inventor: Mirmajid Seyyedy, Boise, Id.

[73] Assignee: Micron Technology, Inc., Boise, Id.

[21] Appl. No.: 08/924,544

[22] Filed: Aug. 27, 1997

[51] Int. Cl.[6] .................................................. G11C 11/22
[52] U.S. Cl. ...................... 365/145; 365/149; 365/230.06
[58] Field of Search .................................... 365/145, 149, 365/230.06

[56] References Cited

U.S. PATENT DOCUMENTS

| | | | |
|---|---|---|---|
| 5,373,463 | 12/1994 | Jones, Jr. | 365/145 |
| 5,424,976 | 6/1995 | Cuppens | 365/145 |
| 5,608,667 | 3/1997 | Osawa | 365/145 |
| 5,640,030 | 6/1997 | Kenney | 365/145 |

*Primary Examiner*—Son T. Dinh
*Attorney, Agent, or Firm*—Schwegman, Lundberg, Woessner & Kluth, P.A.

[57] ABSTRACT

A ferroelectric memory is described which has a memory array arranged in rows and columns. The memory array includes a plate line which is segmented into sub-plate lines which correspond to a row of the memory. The plate line segments have multiple driver circuits coupled thereto for providing a plate line voltage signal. The memory array can include a global plate line coupled to the segments of the segmented plate line via an access switch, or transistor. A global plate line voltage is controlled by multiple plate line driver circuits.

19 Claims, 13 Drawing Sheets

५,९१७,७४६

CELL PLATE STRUCTURE FOR A FERROELECTRIC MEMORY

This invention was made with government support under Contract No. MDA972-94-C-0006 awarded by Advanced Research Projects Agency (ARPA). The Government has certain rights in this invention.

TECHNICAL FIELD OF THE INVENTION

The present invention relates generally to ferroelectric memories and in particular the present invention relates to a cell plate structure and drivers for a ferroelectric memory.

BACKGROUND OF THE INVENTION

Placing ferroelectric material between the plates of a capacitor on a semiconductor substrate causes the capacitor to exhibit a memory effect in the form of charge polarization between the plates of the capacitor. In effect, when the capacitor is charged with the field lines running in one direction across the capacitor plates, a residual charge polarization remains after the charge is removed from the capacitor plates. If an opposite charge is placed on the capacitor plates, an opposite residual polarization remains. A plot of the applied field voltage (E) across the plates of the capacitor against the polarization (P) of the ferroelectric material between the plates of the capacitor exhibits a classic hysteresis curve as shown in FIG. 1. This type of hysteresis response of ferroelectric material between the plates of the capacitor manufactured on a semiconductor die as known in the art and is described in U.S. Pat. No. 4,873,664 to Eaton Jr., which is incorporated herein by reference.

Using ferroelectric material in the manufacture of capacitors for use in the cells of memory arrays is also known in the art. By applying a coercive voltage across the plates of the ferroelectric capacitor to produce one polarization or another, the residual polarization stores a nonvolatile 1 or 0 in the cell. If a ferroelectric capacitor has zero volts applied across its plates, it may be polarized as indicated by either point A or point D in FIG. 1. Assuming that the polarization is at point A, if a positive voltage is applied across the capacitor which is greater than the "coercive voltage" indicated by line B, then the capacitor will conduct current and move to a new polarization at point C. When the voltage across the capacitor returns to zero, the polarization will remain the same and move to point D. If a positive voltage is applied across the capacitor when it is polarized at point D, the capacitor will not conduct current, but will move to point C. It can be seen that a negative potential can be used to change the polarization of a capacitor from point D to point A. Therefore, points A and D can represent two logic states occurring when zero volts are applied to the capacitor and which depend upon the history of voltage applied to the capacitor.

The reading of the polarization of the ferroelectric capacitor can be a destructive read in which a pulse is applied to the ferroelectric capacitor and the amount of resultant charge is either low if the pulse polarity agreed with the previous memorization polarity, or the resultant charge is higher if the charge polarity placed on the capacitor is of the opposite polarity last placed across the plates of the capacitor. This minute difference between an agreeable charge and an opposite charge can be measured to determine what the previous polarization on the ferroelectric capacitor was as it was last written. If a large charge results from reading a memory cell, the memory cell polarization will move from one state to the other state, for example point A to Point D. Thus, the data read from the memory cell must be restored.

The fact that the ferroelectric capacitors require a destructive read to determine the last polarization, and the fact that the resultant charge differences of the ferroelectric capacitor between an agreeable applied pulse and an opposite applied pulse make the technique of reading and writing ferroelectric memories a difficult task. The benefit of having a nonvolatile memory in which stored data remains without any battery backup or other external application of power is of great use in the computer and control industries. However, for any such nonvolatile memories to be of any use, the memories must be of a high enough density and must have a fast enough response time to make them commercially more attractive than battery backed up DRAM, mechanical disk storage and other types of nonvolatile storage.

Ferroelectric memories traditionally do not have high operating speeds comparable to that of DRAM storage devices. Referring to FIG. 2, each memory storage cell comprises a pair of ferroelectric capacitors and a pair of access transistor. One plate of the pair of ferroelectric capacitors is connected to a plate line, while the other plates of the ferroelectric capacitor are connected through access transistors to separate bit lines. In operation, a momentary voltage pulse is placed on the ferroelectric capacitors between the bit lines and the plate line to polarize the ferroelectric material of the two ferroelectric capacitors, resulting in a polarization of one direction for one capacitor and an opposite polarization for the second ferroelectric capacitor. This concept can be taken a step further by using a regular array of ferroelectric capacitors, whereby each cell contains two ferroelectric capacitors and two access transistors. The ferroelectric capacitors within each memory cell receive complementary input signals such that the ferroelectric capacitors are polarized in opposite states to indicate a 1 or a 0. When the pairs of capacitors for each cell are read, a resulting voltage on the bit lines, which result from applying a pulse on a plate line, is compared using a differential sense amplifier to compare the voltages on the bit lines and thus determine the polarity on the ferroelectric capacitors within the cell. The disadvantage of the above approach is that it requires that each cell contain at least two transistors and two ferroelectric capacitors. This approach takes up a large area of the chip for implementation, which limits the overall density of a memory array.

Ferroelectric memories have an array of memory cells which can be arranged in rows and columns where a row of cells share a common plate line. A memory array typically has a plate line which is associated with a row of memory. The plate line is a single conductor which is driven by a single driver circuit. Alternately, a memory can include a divided plate line. The plate line for a row of the array in this architecture is separated into different sections which are driven by a single driver circuit. See 1194 IEEE International Solid-State Circuits Conference, Digest of Technical Papers, "A 256 kb Nonvolatile Ferroelectric Memory at 3 V and 100 ns" by Tatsumi Sumi, February 1994 for a description of a divided plate line memory device, incorporated herein by reference. See also U.S. Pat. No. 5,638,256, and U.S. patent application Ser. No. 08/520,257 for descriptions of a ferroelectric memory device, incorporated herein by reference.

Still lacking in the industry is a ferroelectric capacitor cell memory array using a RAM architecture which provides a fast efficient cell plate operation and structure. For the reasons stated above, and for other reasons stated below which will become apparent to those skilled in the art upon reading and understanding the present specification, there is a need in the art for a ferroelectric memory which has segmented plate lines and a plurality of plate line drivers.

SUMMARY OF THE INVENTION

The above mentioned problems with ferroelectric memories and other problems are addressed by the present invention and which will be understood by reading and studying the following specification. A ferroelectric memory is described which has segmented plate lines with a plurality of plate line drivers.

In particular, the present invention describes a memory device comprising an array of ferroelectric memory cells arranged in rows and columns. The memory cells have a first plate and a second plate. A plurality of plate line segments are provided which correspond to each row of the array. The plate line segments are coupled to the second plate of the memory cells. A plurality of plate line driver circuits are provided and are coupled to each one of the plate line segments.

In another embodiment, a memory device comprises an array of ferroelectric memory cells arranged in rows defined by wordlines and columns defined by bit lines. The memory cells has a first plate coupled to a bit line through an access transistor having a gate couple to a wordline for selective activation. The memory includes a plurality of cell plate segments corresponding to the wordlines, and coupled to a second plate of the memory cells. A global plate line is coupled to the plurality of cell plate segments through coupling transistors. Finally, a plurality of global plate line drivers are provided and coupled to the global plate line for providing plate line signals.

In yet another embodiment, a method of operating a ferroelectric memory device is described. The method comprises the steps of providing an activation signals on a wordline to couple a memory cell to a digitline, providing a plate line signal on a plurality of plate line segments corresponding to the wordline, and reading data stored in the memory cell. The plate line signal is generated using a plurality of plate line driver circuits

BRIEF DESCRIPTION OF THE DRAWINGS

In the drawings, where like numerals refer to like components throughout the several views.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

This invention concerns electrical circuitry which uses voltages to represent the two binary logic levels. The words "low" and "high" in this specification refer generally to the false and true binary logic levels, respectively. Signals are generally considered active when they are high, however, an asterisk (*) following the signal name, or a bar above the signal name in this application indicates that the signal is negative or inverse logic. Negative or inverse logic is considered active when the signal is low.

Figure 1:
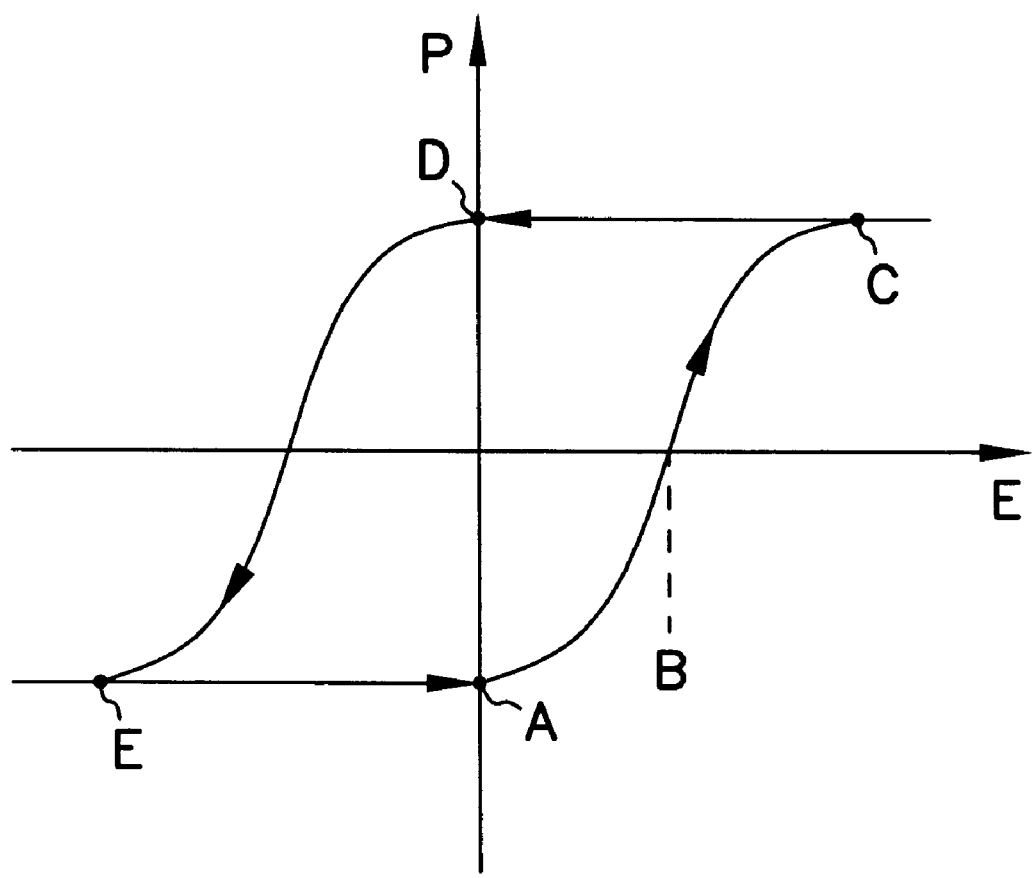
FIG. 1 is a hysteresis curve of a ferroelectric capacitor.
Figure 2:
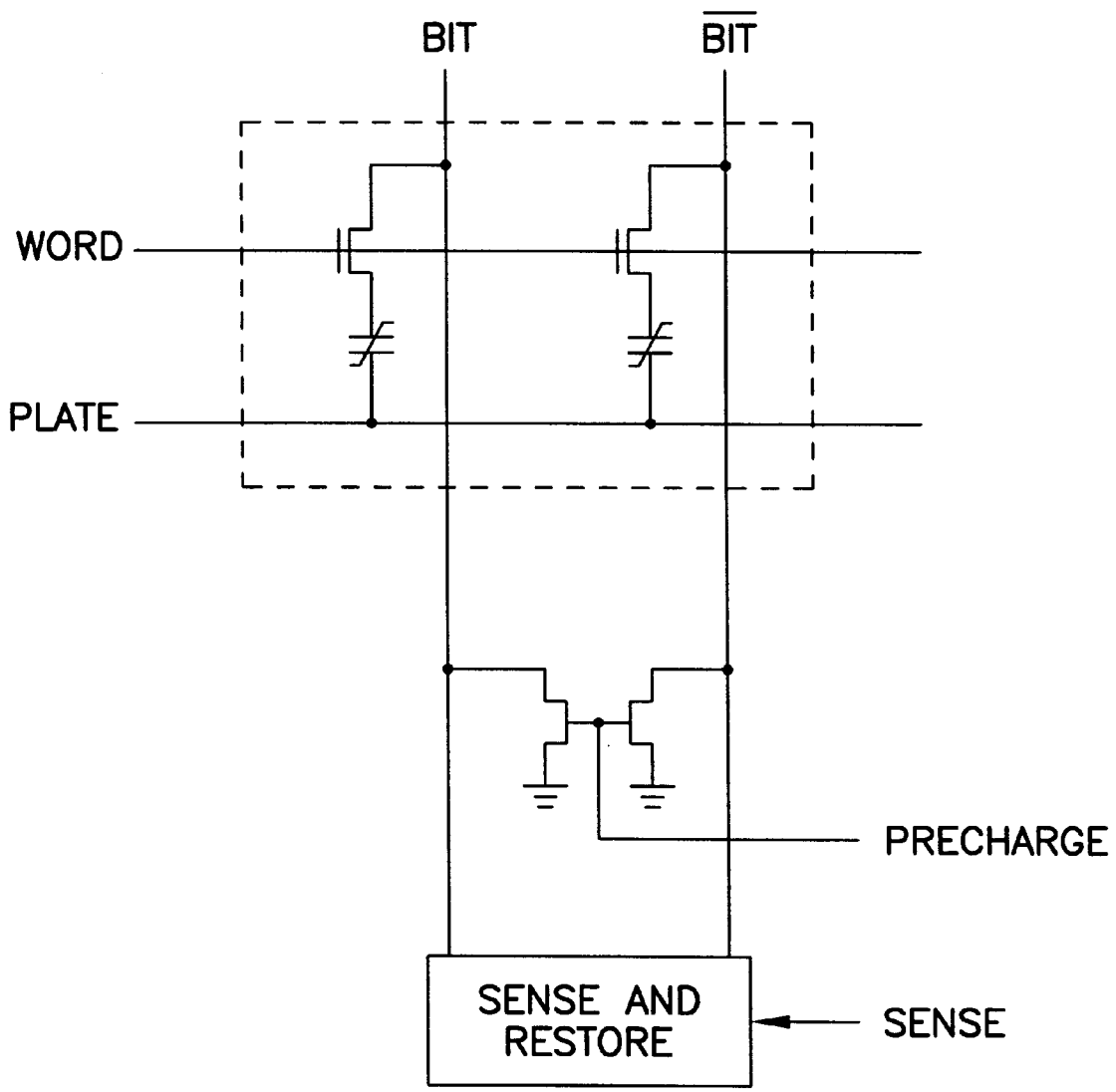
FIG. 2 is a prior art ferroelectric memory having two capacitors per memory cell.
Figure 3:
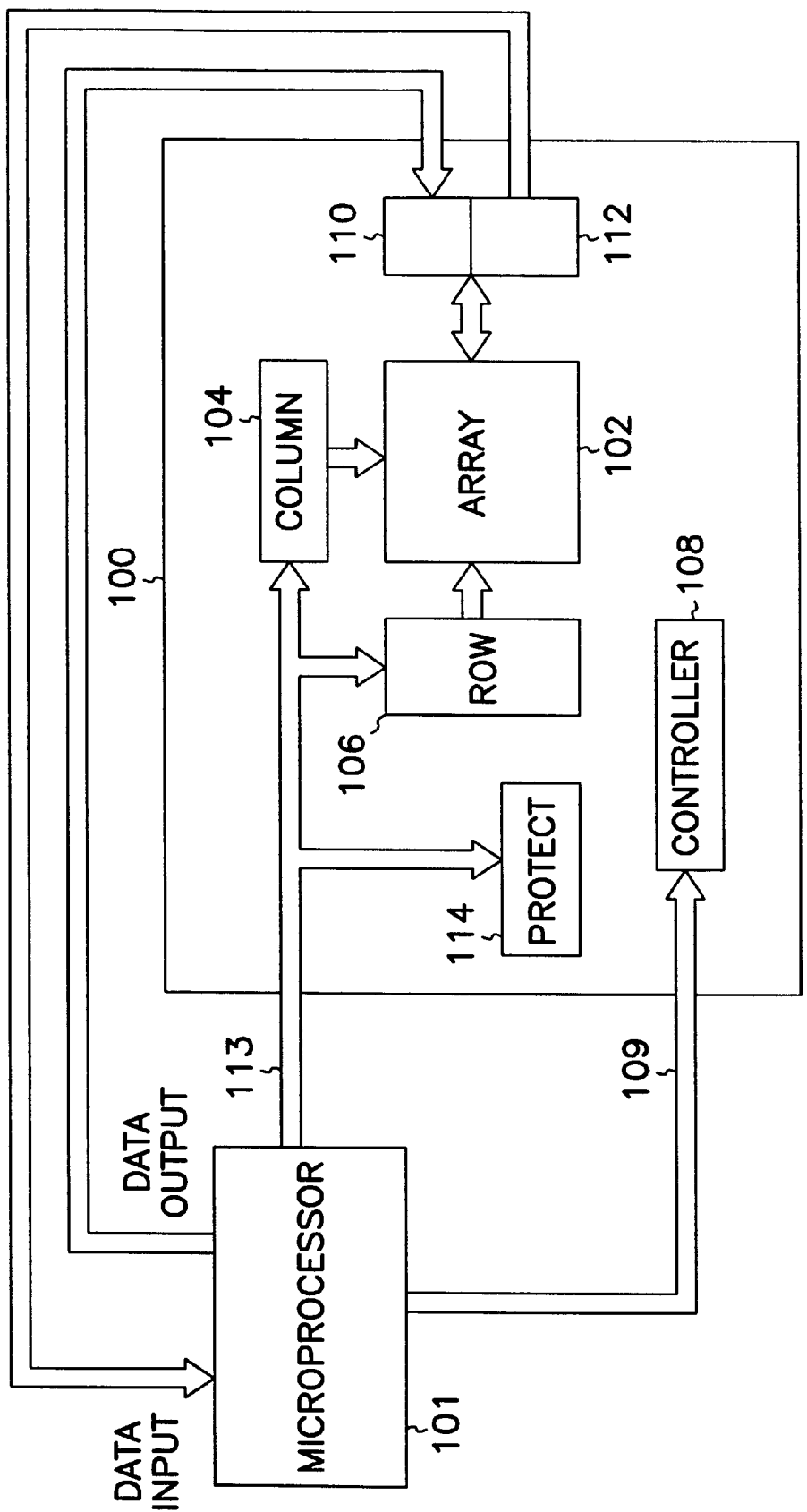
FIG. 3 is a block diagram of a memory incorporating the present invention.

FIG. 3 shows a general block diagram of a memory circuit 100 incorporating the present invention. The memory circuit is coupled to a microprocessor 101 and includes a memory array 102, column 104 and row 106 decoders, and a control circuit 108. The memory circuit also includes input 110 and output 112 buffers connected to data input and data output lines, respectively. The data input and output lines can be multiplexed together, but have been illustrated separately for simplicity. Address lines 113 are provided as input to the row and column decoders to address a portion of the memory array.

In operation, the memory circuit control 108 responds to control inputs 109 from the microprocessor to perform different operations on the memory array. In particular, the control circuit is used to read data from and write data to the memory array 102. During one of these access operations, an address provided on the address lines 113 is decoded by the row decoder 106 to access one row of the memory array. Likewise, input provided on the address lines is decoded by the column decoder 104 to access at least one column of the memory array. During a read operation, the data stored in the addressed memory cell(s) is then transferred to the output buffer 112 and provided on the data output lines. In a write operation, the addressed memory cell is accessed and data provided on the data input lines is stored in the cell.

Figure 4:
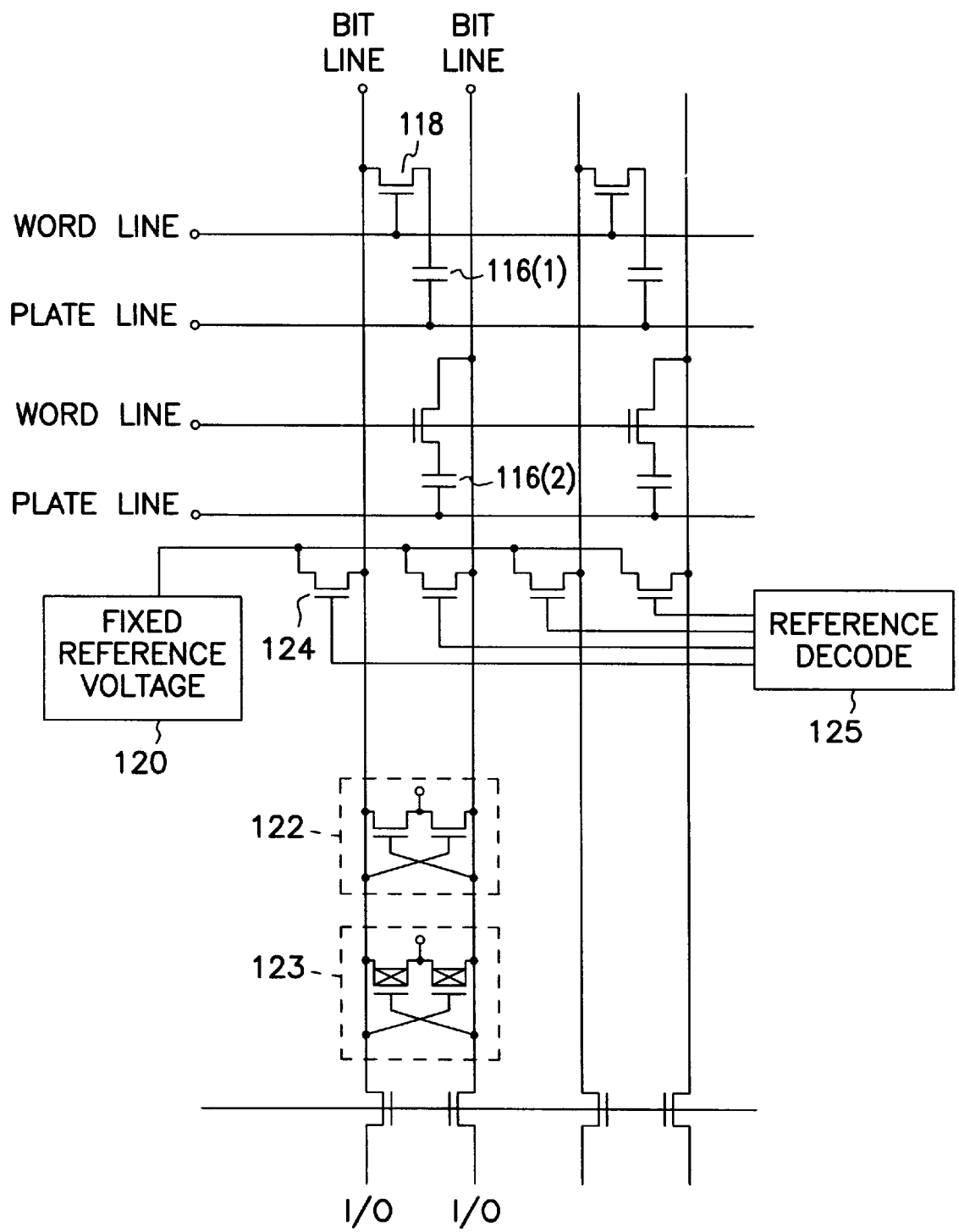
FIG. 4 is a portion of a ferroelectric memory array having a folded bit line architecture and single-ended reference circuit of FIG. 3.

FIG. 4 illustrates the basic concept of a portion of a ferroelectric memory array shown in FIG. 3, a detailed description of array 102 is provided below with reference to FIGS. 7 and 8. Two communication lines, Bit line 1 and Bit line 2, couple ferroelectric memory cell capacitors 116 to the data I/O lines which are connected to input and output buffers. The memory cells have one plate connected to a plate line and the other plate connected to an n-channel MOS access transistor 118. The gate of the access transistor is connected to a word line. The word lines and access transistors are arranged so that one word line couples a memory cell 116(1) to Bit line 1, and the next word line couples a memory cell 116(2) to the Bit line 2. In one embodiment, the plate line can be fabricated using Platinum.

To access a memory cell, the external address lines 113 are decoded to identify which row of the memory array is to be accessed. The corresponding word line is then raised to a high voltage level so that all of the access transistor having their gate connected to that word line are activated. All of the memory cells associated with that word line, therefore, are coupled to one of the bit lines. If the memory cell were a standard DRAM capacitor, the charge stored on the memory cell capacitors would be shared with the bit lines when the access transistor 118 is activated. Likewise, a ferroelectric memory cell having some non-remnant charge stored thereon will produce a small change to the bit line voltage. If the non-remnant component of the ferroelectric memory cell has been discharged, the bit line voltage will not change. To access the data stored in the memory cell, the plate line associated with the addressed row is pulsed high. As known to one skilled in the art, if the polarization of the ferroelectric dielectric is in one state and the plate line is pulsed high, the current through the memory cell 116 will increase the voltage on the bit line which is coupled thereto. If the polarization of the memory cell is in the opposite state, current through the memory cell is resisted and the voltage of the coupled bit line does not change.

The change in the voltage on the bit line can be sensed using a sense amplifier circuit and a reference circuit 120 which produces a reference voltage. The sense amplifiers are typically comprised of both an n-sense 122 and a p-sense 123 amplifier and detect the difference in the voltage on the bit line and the reference circuit voltage coupled to the other bit line via coupling transistor 124, as known to one skilled in the art. The sense amplifiers drive the bit line pairs to the appropriate voltage rail. That is, if the voltage of the bit line is higher than the reference circuit voltage, the bit line is driven to the positive voltage rail. Conversely, if the bit line is lower than the reference circuit, the bit line is driven to ground. It will be recognized that different sense amplifier and reference circuits can be used without departing from the spirit of the present invention. A reference decode circuit 125 is provided to selectively connect the reference voltage to the unused bit line. By reading the memory cell, the state of the polarization may be reversed and thus the data which was stored on the cell will be revered. That is, in one embodiment the polarization of the dielectric is such that a logical "one" provides a change in voltage of the digit line. To provide the requisite voltage change on the bit line, the polarization of the dielectric is changed. To read a logical one, therefore, the polarization of the memory cell is changed by reading the cell and will represent a logical "zero" after the cell has been read. If, on the other hand, the memory cell was storing a zero, there will be no voltage change on the bit line and the memory cell will remain polarized in a zero state. It can be seen that by merely reading a memory cell the data will be lost if the memory cell was storing a one. A write-back operation must be performed on the memory cell so that the polarization of the memory cell is returned to its pre-read state.

To write a one to the memory cell 116, the bit line coupled to the memory cell must be raised to the positive voltage rail while the plate line is at a low potential. This reverses the polarization of the ferroelectric dielectric which resulted from pulsing the plate line high. The sense amplifiers 122 and 123 are used to write-back a logical one to a memory cell from which a one was read. All of the sense amplifiers associated with a row of memory cells in the memory array are strobed at once. If the column address, therefore, is changed during the read operation, the data stored in any one of the memory cells of a row will not be lost. If, however, the row address is changed during the read operation prior to the sense amplifiers driving the active bit line to a full positive voltage rail, the access transistor 118 connected to the addressed memory cell will be turned off and the data cannot be re-written to the memory cell.

Figure 5:
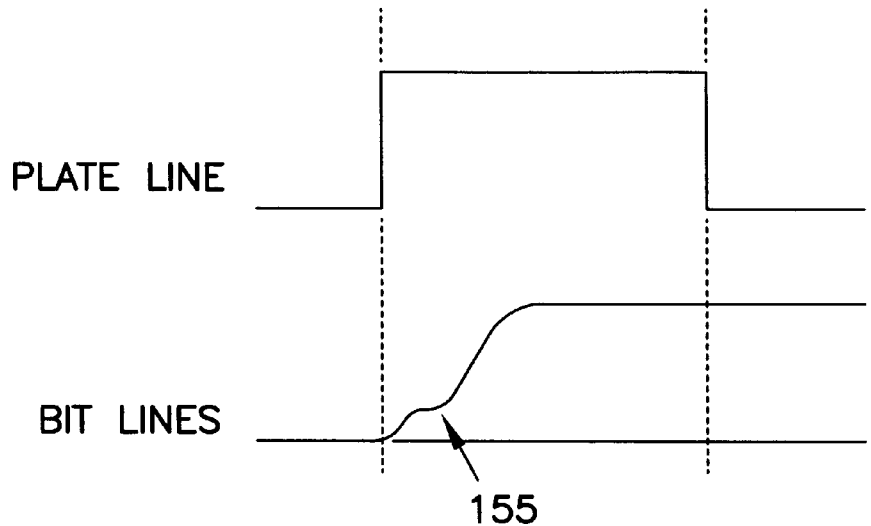
FIG. 5 is a timing diagram of a clocked plate method of accessing a ferroelectric memory cell of FIG. 3.
Figure 6:
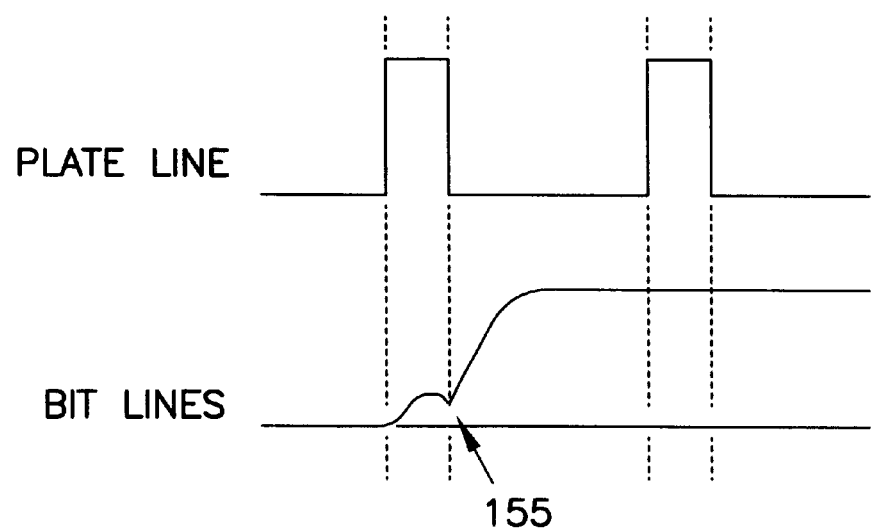
FIG. 6 is a timing diagram of a pulsed plate method of accessing a ferroelectric memory cell of FIG. 3.

It will be helpful to fully understand the effect of the voltage placed on the memory cell capacitor plates. FIGS. 5 and 6 illustrate two alternate ways of reading a ferroelectric memory and restoring the data read therefrom. The first method is referred to herein as a clocked plate line, as illustrated in FIG. 5. To access a memory cell, a word line is selectively raised. The plate line of the memory cell is then raised and the data stored on the cell is coupled to the bit line as described above. If the memory cell was storing a 1, the memory cell was rewritten to a 0 merely by reading the cell. The sense amplifiers are then fired, at reference number 155, so that the bit lines are driven to full voltage rails. Because the plate line is high when the bit lines are driven to rail, a 1 is not restored on the memory cell. A 1 will be restored when the plate line goes low while the bit line is high. It will be understood that the bit line potentials can be reversed to change the data on the memory cell and that a 0 will be written to the cell when the bit line is low while the plate line is high.

The second method of reading and restoring a memory cell is referred to as a pulsed plate line and illustrated in FIG. 6. To read the cell, the plate line is pulsed high twice while the cell is coupled to a bit line. The data stored on the memory cell will be reflected on the bit line after the first pulse and the bit line pair is then driven to voltage rails, at reference number 155. If the bit line coupled to the memory cell goes high while the plate line is low, the memory cell will be written to a 1. If the potential on the bit lines are reversed to change the data on the memory cell, a 0 cannot be written to the cell until the plate line is pulsed high again. The plate line is therefore pulsed high a second time to insure that the memory cell stores the proper data.

Because the polarization of the ferroelectric memory cell is determined by the potential of both of the cell's plates at any given time. That is, a 1 is stored anytime the bit line is high while the plate line is low, and a 0 is written anytime the plate line is high while the bit line is low. If both plates are at the same potential, the data stored on the cell is not changed. It can be appreciated that the clocked plate line method is an efficient way of reading from and writing new data to a memory cell, and that the pulsed plate line method is an efficient way of reading and restoring data from a memory cell.

Reference Voltage Circuit

Figure 7:
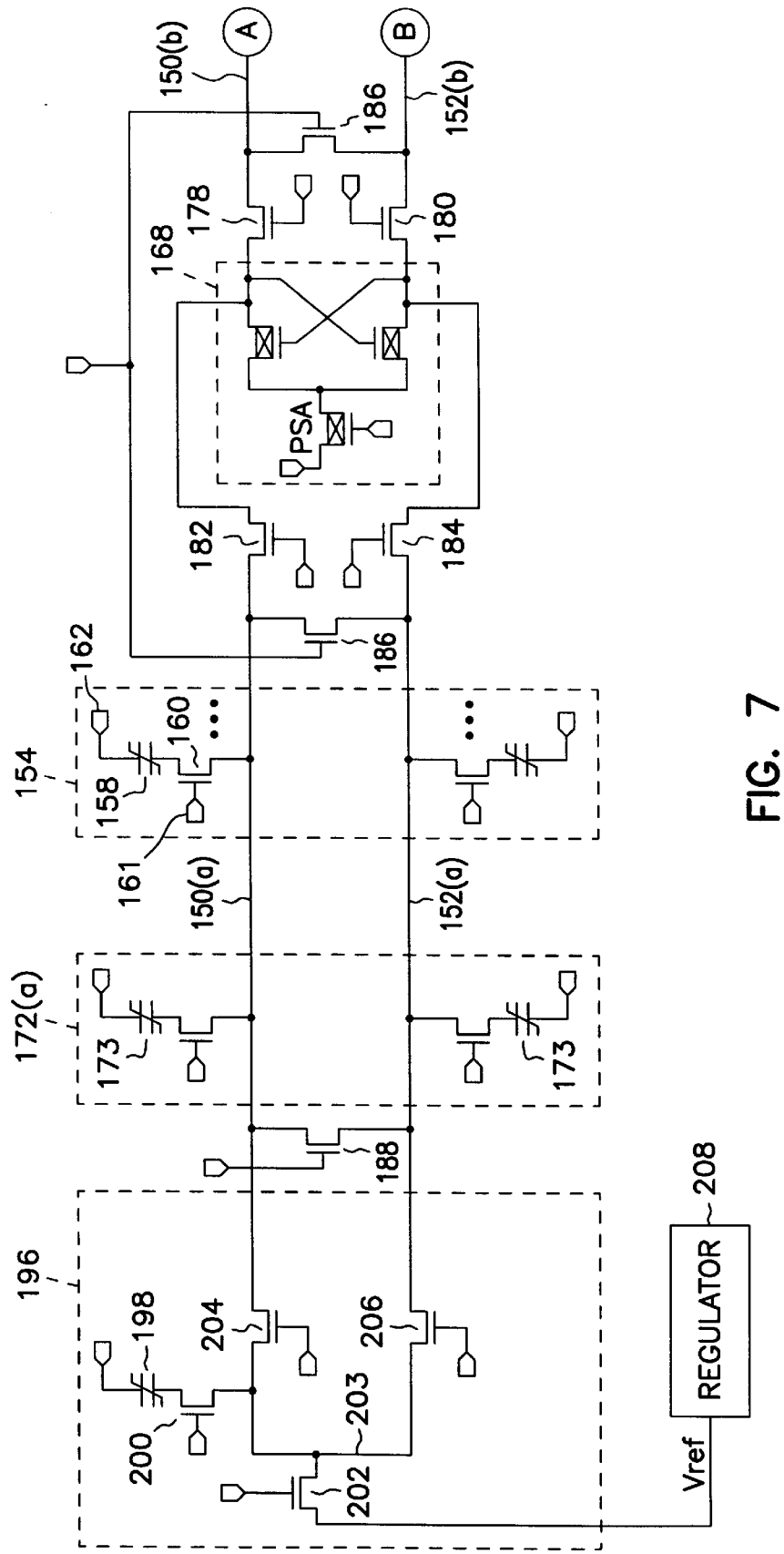
FIGS. 7 and 8 are schematic diagrams of a pair of bit lines and associated circuitry of the memory of FIG. 3.
Figure 8:
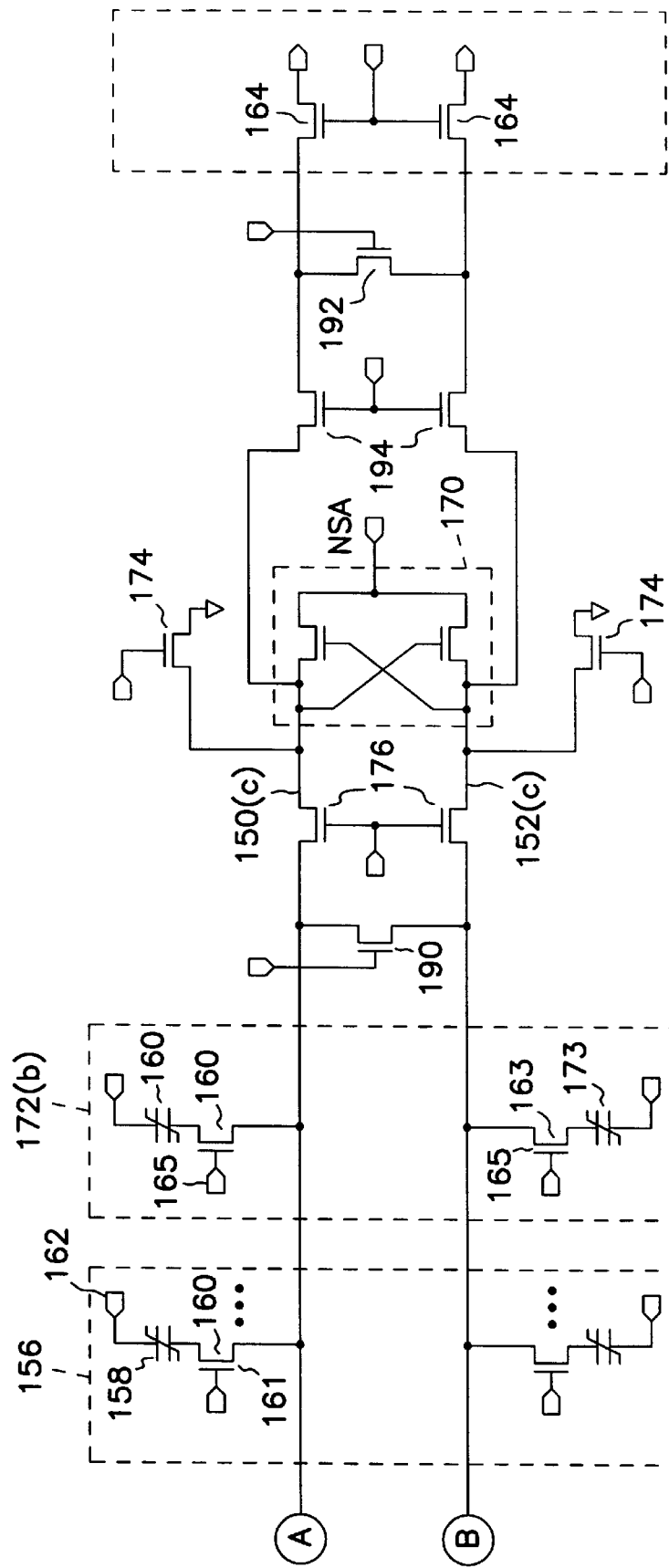

Referring to FIGS. 7 and 8 a portion of the memory array 102 of the memory circuit of the present invention shown in FIG. 3 is described in detail. As stated above, the memory array is arranged in addressable rows and columns, and a memory cell is located at the intersection of each row and column. One memory cell can therefore be accessed by selecting both a row and a column. The memory array is, conceptually, arranged as a plurality of memory cell planes having common rows. This arrangement allows one memory cell in each plane to be accessed by selecting one row and addressing a column in each plane. For example, by using eight planes of memory cells, one byte of data can be stored to, or retrieved from, the array by addressing one row and one column of the array. Each memory array plane, therefore, has a separate input/output connection.

In the present invention, each column of a plane of memory is arranged as a pair of folded bit lines 150 and 152. The bit lines can be electrically separated into sections using isolation transistors, and are represented in FIGS. 7 and 8 by three sections (a), (b), and (c) Each column contains 1024 addressable memory cells with each one capable of storing one bit of data. These memory cells are arranged in two 512-bit sub-arrays 154 and 156. Each sub-array therefore has 512 memory cells which can be coupled to the bit lines. The memory cells are each comprised of a single ferroelectric capacitor 158 which has one plate connected to a plate line 162 and a second plate connected to a n-channel access transistor 160. The gates 161 of the access transistors are connected to word lines. Each word line is associated with a row of the memory array such that by addressing one row of the array, one word line is raised to activate one access transistor in each column. Bit lines 150 and 152 each have an I/O transistor 164 which are used to select the column of the memory array to access via the data input/output lines.

The bit lines are connected to a p-sense amplifier 168, as known to one skilled in the art, located between the sub-arrays 154 and 156. The p-sense amplifier is used to sense a differential voltage between the bit lines and drive the bit line with the higher voltage to a full power supply positive rail. An n-sense amplifier 170 located between sub-array 156 and the I/O transistors 164 is also connected to both bit lines. The n-channel sense amplifier, as known to one skilled in the art, is used to sense a differential voltage between the bit lines and drive the bit line with the lower voltage to the full negative voltage rail, typically ground.

In general, to read data from a memory cell, the bit lines are equilibrated to a predetermined level. The memory cell is then coupled to one of the bit lines by activating the gate of its access transistor. Once the memory cell is coupled to a bit line, the plate line is pulsed high such that a voltage is imparted on the bit line if the memory cell was storing one data logic state, for example a 1. If the memory cell was storing a 0, the voltage on the digit line would remain at the equilibrated level. As explained below, the voltage generated by reading a logic 1 is small and must be amplified before coupling the bit lines to the I/O lines. To amplify the bit line coupled to the selected memory cell, a reference voltage is coupled to the other bit line prior to activating the p-sense amplifier and the n-sense amplifier. The reference voltage is a voltage between the equilibrate level and the voltage created by reading a logic 1. Two different reference circuits and methods are described herein for producing the reference voltage.

The first reference circuit is comprised of two pairs of ferroelectric memory cells 172(*a*) and (*b*). Each pair is located beside one of the sub-arrays and on opposite sides of the p-sense amplifier 168. Each of the ferroelectric capacitors 173 of a reference cell pair stores a different logic state. That is, one of the capacitors stores a logic 1, while the other capacitor stores a logic 0. By coupling the bit lines together after they have been coupled to the capacitors, a reference voltage can be generated which has a voltage level that is half the level of a logic 1 voltage.

Some of the other circuitry illustrated includes equilibrate transistors 186, 188, 190, and 192. Isolation transistors 176 and 194 are used to couple the n-sense amplifier to either the bit lines 150 and 152, or transistors 164. Isolation transistors 178, 180, 182, and 184 are provided to selectively couple two of the bit lines 150(*a*), 150(*b*), 152(*a*), or 152(*b*) to the p-sense amplifier. Transistors 174 are used to couple the n-sense amplifier to ground and transistor 192 is used to equilibrate the n-sense amplifier.

Figure 9:
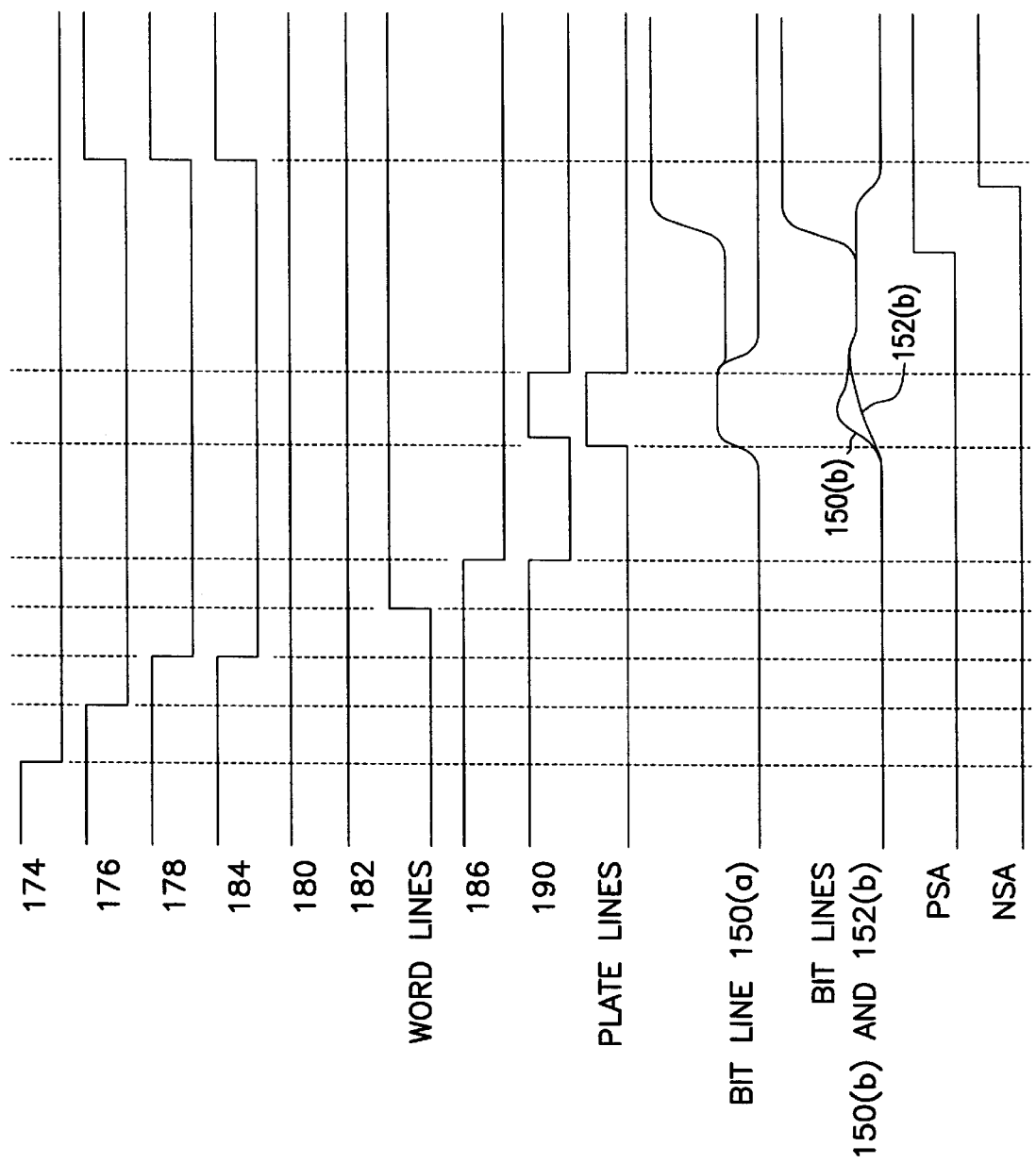
FIG. 9 is a timing diagram illustrating the operation of the reference cell circuit of the schematic of FIGS. 7 and 8.

To fully understand how the reference circuit is used to read a memory cell, reference is made to the timing diagram of FIG. 9. To read data stored in a memory cell which is to be coupled to bit line 150(*a*), the bit lines must be equilibrated to a low voltage level. N-channel transistors 174 are, therefore, activated so that bit lines 150 and 152 are pulled low. By activating isolation transistors 176, 178, 180, 182 and 184 while the transistors 174 are activated, all three sections of the bit lines are pulled low. Equilibrate transistors 186 and 190 are activated to insure that both bit lines are at equal voltage levels. Transistors 174 and 176 are then deactivated to decouple the bit lines from ground, and isolate section (c) of the bit lines, respectively. Transistor 178 is turned off to isolate bit line 150(*b*) from sense amplifier 168. Similarly, transistor 184 is turned off to isolate bit line 152(*a*) from sense amplifier 168. Isolation transistors 180 and 182 remain activated.

Once the appropriate sections are isolated from the p-sense amplifier 168 a word line can be selectively raised to couple a memory capacitor 158 to bit line 150(*a*). Although the memory cell described herein is coupled to bit line 150(*a*), it will be recognized that any of the memory cells can be read by selectively controlling isolation transistors 178, 180, 182 and 184. Equilibrate transistors 186 and 190 are then turned off. As stated above, the voltage on the bit line will not change until the plate line is pulsed. While the memory cell plate line is pulsed, the voltage on the bit line will increase. The bit line will remain high if the capacitor is storing a logic 1. If the capacitor is storing a logic 0, the bit line will return low when the plate line returns low. On the opposite side of the p-sense amplifier, the two reference cell capacitors 173 of reference circuit 172(*b*) are coupled to bit lines 150(*b*) and 152(*b*) via transistors 163. The reference cell plate lines are pulsed at the same time the memory cell plate lines are pulsed. For clarification, the bit lines which are coupled to the reference cell capacitors are referred to herein as reference bit lines. Because the reference cell capacitors are storing opposite logic levels, only one bit line will increase in voltage level.

Activating equilibration transistor 190 while the plate lines are being pulsed couples bit lines 150(*b*) and 152(*b*) together and shares the individual line voltages such that a voltage level is created that is between the equilibrate voltage level (ground) and the logic 1 level. It will be appreciated that by using ferroelectric capacitors, the reference voltage accurately tracks the voltage created by the ferroelectric memory cells.

To sense the data stored in the accessed memory cell, the p-sense amplifier is fired so that the bit line, 150(*a*) or 152(*b*), with the highest voltage level is pulled to a high voltage level. Isolation transistors 176, 178 and 184 are then activated to couple the bit lines to the n-sense amplifier 170. The n-sense amplifier is then fired to drive the bit line, 150(*c*) or 152(*c*), with the lowest voltage level to ground.

As explained above, a memory cell which had a logical 1 stored thereon was rewritten to a logical 0 merely by reading the memory cell. The memory cell will be returned to a logical 1, however, when the bit line is driven high while the memory cell plate line is low. The pair of reference circuit capacitors will also be restored to opposite states on the same cycle as the accessed memory cell. It is preferred to pulse the plate lines high a second time after both sense amplifiers have been fired so that the bit lines are at full voltage rails. It will be recognized that the reference cell plate line and the memory cell plate line can be pulsed together. The reference circuit capacitor 173 coupled to the low bit line will be written to a 0 and the capacitor 173 coupled to the high bit line will remain written to a 1. It is also preferred to discharge the memory capacitors 158 and the reference capacitors 173 prior to turning access transistors 160 and 163 off to reduce fatigue caused by non-remnant charges. Because the capacitors can be written to a logical 1 by raising the voltage on the bit line, traditional equilibration techniques cannot be used. That is, coupling the bit lines together will lower one bit line while raising the other. Transistors 174 are therefore used to pull both bit lines to ground to discharge the cells without effecting the data stored thereon.

The above described reference circuit which uses a pair of ferroelectric memory cells to generate the reference voltage can become fatigued with time. The advantage of having a reference voltage generated by ferroelectric capacitors which perform in the same manner as the memory cells is tainted by the possibility that the reference voltage may change over time. That is, every time a ferroelectric cell is fired, the performance of the material is slightly degraded. Because the reference cells 173 are fired substantially more often than the memory cells 158, there is a possibility that the reference cells will degrade faster and the resultant reference voltage will change over time. To insure that the reference voltage is stable and located between the voltages resulting from the two logic states, a reference circuit is provided which stores a non-remnant charge on a reference capacitor.

The reference charge circuit 196 includes at least one ferroelectric capacitor 198. Although the capacitor is ferroelectric, it is operated as a standard non-remnant capacitor. The capacitor can be selectively coupled to either of the bit lines 150 or 152 by activating either isolation transistor 204 or 206. Transistors 202 and 200 can be activated to couple the capacitor 198 to a reference voltage, Vref, provided by a voltage regulator 208. In theory, a voltage regulator circuit could be used to provide the reference voltage directly, however, changes in the external power supply voltage would effect the regulated voltage level. Changes in the reference voltage could result in the inability to read data stored in a memory cell. This is because the voltage produced by the ferroelectric memory cell is not dependent upon the supply voltage and is therefore not effected by changes in the supply voltage.

The ferroelectric capacitor 198 and the capacitance of line 203 have a substantially lower combined capacitance than the line capacitance of either bit line 150 or 152. It is preferred that the reference capacitance be about 1/10 the size of the bit lines. This capacitance ratio allows the reference capacitor to be charged to Vref and then shared with the bit line capacitance. Thus, charge conservation defined by $C1*V1+C2*V2=C_{FINAL}V_{FINAL}$ where C1 is the bit line capacitance and C2 is the reference capacitance, can be used to determine the final voltage on the bit line after the reference capacitor has been coupled thereto. For example, if the reference capacitor has been charged to 4 volts and the bit line has been equilibrated to 0 volts, the final bit line voltage after capacitor 198 is coupled to the bit line is defined as:

$$V_{FINAL}=C2*4/C_{FINAL},$$

or $$V_{FINAL}=4/10=0.4 \text{ volts}$$

It can be seen that if the reference voltage fluctuates with changes in the supply voltage, the final bit line voltage will only change by 1/10 of the fluctuation. The reference voltage, therefore, is substantially supply voltage independent.

Capacitor 198 can be a plurality of parallel capacitors such that a laser or electronic key, as known to one skilled in the art, can then be used to "trim" the capacitance so that the final reference voltage level on the bit line is between ground and the voltage generated by a memory cell storing a logic 1. Further, the reference capacitor is not limited to ferroelectric capacitors but can be any non-remnant capacitor.

A course adjustment of the reference voltage can be made by adjusting the regulated voltage, while a fine adjustment can be made by changing the number of capacitors 198 coupled to line 203. By changing the regulated voltage cell margin can be measured for the memory circuit. This is accomplished by systematically raising the reference voltage until a memory cell storing a logical 1 is read as a logical 0. That is, when a memory cell is read incorrectly the reference voltage is above the memory cell voltage. The difference between the beginning reference voltage and the voltage at which the memory cell is erroneously read is the cell margin.

Figure 10:
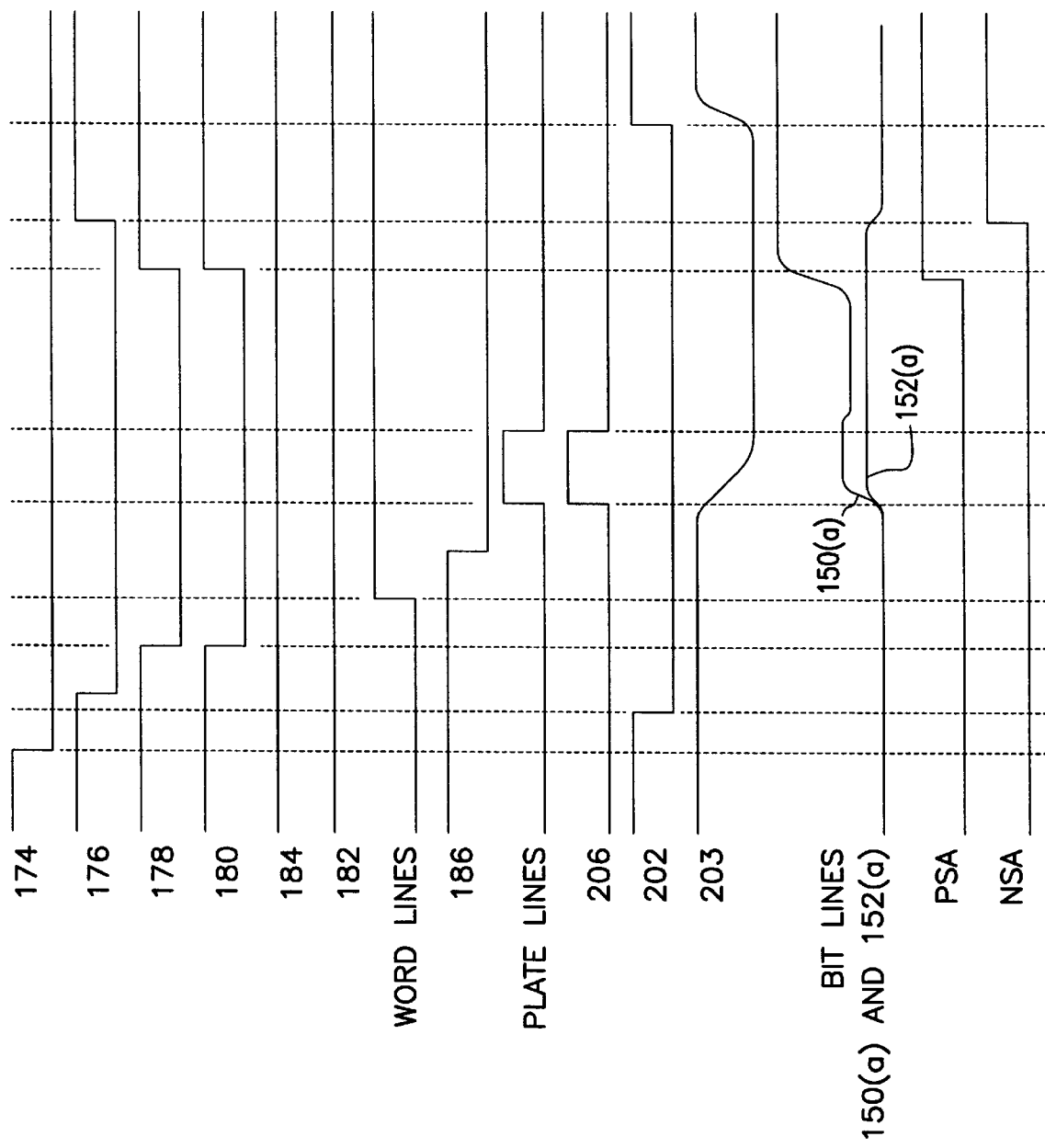
FIG. 10 is a timing diagram illustrating the operation of the reference charge circuit of the schematic of FIGS. 7 and 8.

In operation, a memory cell is read in a similar manner to that described above using the reference cell circuit. Referring to FIG. 10, to read data stored in a memory cell which is to be coupled to bit line 150(a), the bit lines must be equilibrated to a low voltage level. N-channel transistors 174 are, therefore, activated so that bit lines 150 and 152 are pulled low. By activating isolation transistors 176, 178, 180, 182 and 184 while the transistors 174 are activated, all three sections of the bit lines are pulled low. Equilibrate transistors 186 are activated to insure that both bit lines are at equal voltage levels. Transistors 174 and 176 are then deactivated to decouple the bit lines from ground, and isolate section (c) of the bit lines, respectively. Transistor 178 is turned off to isolate bit line 150(b) from sense amplifier 168. Similarly, transistor 180 is turned off to isolate bit line 152(b) from sense amplifier 168. Isolation transistors 182 and 184 remain activated so that section (a) of the bit lines are coupled to the p-sense amplifier.

Figure 12:
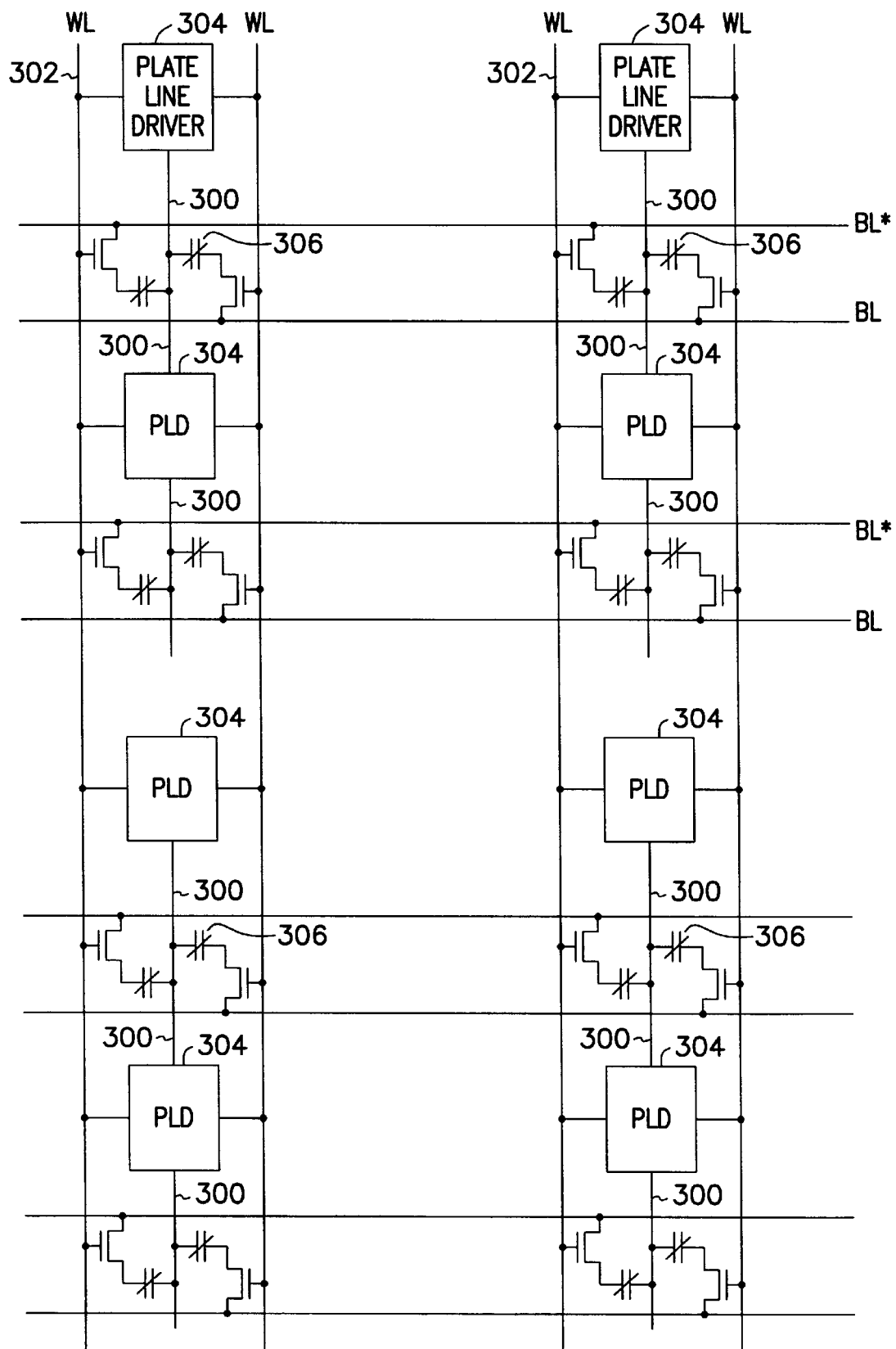
FIG. 12 is a schematic diagram of another plate line having multiple drivers.

Equilibrate transistors 204 and 206 are turned off so that node 203 is isolated from section (a) of the bit lines. Transistor 202 has been turned on so that node 203 and any activated capacitors 198 are charged to the voltage level of the regulator circuit 208. Transistor 202 is then turned off and a word line, or gate of transistor 161, can be selectively raised to couple a memory capacitor 158 to bit line 150(a). Although the memory cell described herein is coupled to bit line 150(a), it will be recognized that any of the memory cells can be read by selectively controlling isolation transistors 178, 180, 182 and 184. Equilibrate transistors 186 are then turned off. As stated above, the voltage on the bit line will not change until the plate line is pulsed. The plate line is pulsed high to read a memory cell. The memory cell illustrated in FIG. 12 is storing a logical 1, such that bit line 150(a) maintains a high voltage after the plate line returns low. The gate of transistor 206 is also pulsed high when the plate line is pulsed so that the charge stored on line 203 is shared with bit line 152(a). By charge sharing line 203 with 152(a), the voltage of line 152(a) is raised to a reference level which is 1/10 the level of line 203.

The p-sense amplifier is fired so that the bit line, 150(a), which has the highest level is driven to the full positive voltage rail. Transistors 178 and 180 activated to couple the p-sense amplifier to the n-sense amplifier, and then the n-sense amplifier is then fired so that bit line 152 is driven to ground. After line 203 is charge shared with a bit line, transistor 202 is re-activated to couple the line to the voltage regulator and recharge both line 203 and capacitors 198. It will be appreciated that both the reference cell circuit 172 and the reference charge circuit can be included in one memory circuit to provide flexibility and redundancy.

Segmented Plate Line with Multiple Drivers

Figure 11:
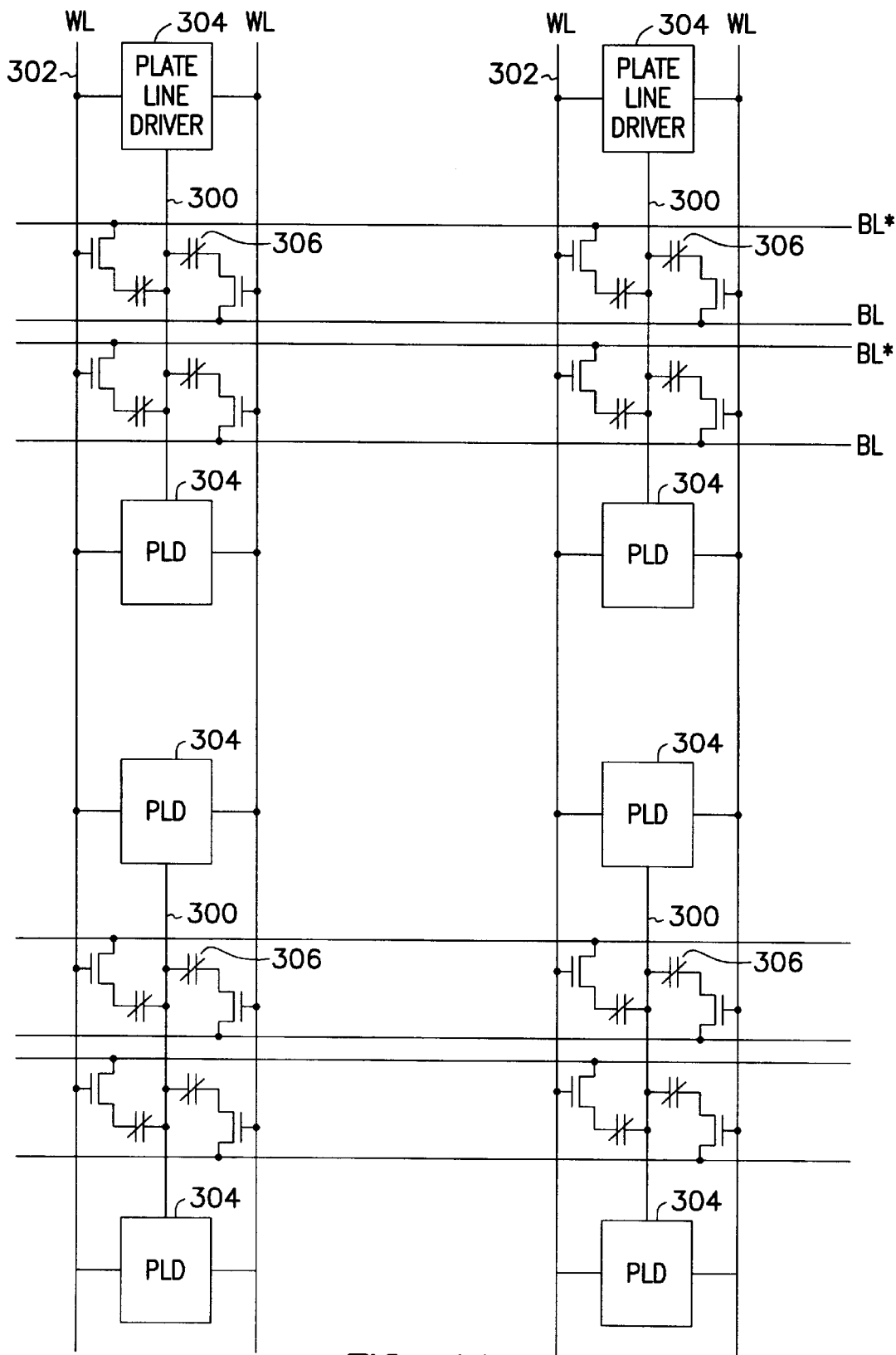
FIG. 11 is a schematic diagram of a plate line having multiple drivers.

Referring to FIG. 11, a ferroelectric memory array of FIG. 3 is described which has divided, or segmented plate lines 300. The plate lines are arranged in a manner which corresponds to a row, or word line 302 of the memory array. Each plate line segment is driven by multiple driver circuits 304. These driver circuits can be located in any position along the plate line section. For example the drivers can be located on opposite ends of the plate line, see FIG. 11. The driver can alternately be located on one end and in the middle of the plate line segment, or any combination of these locations, see FIG. 12.

Figure 13:
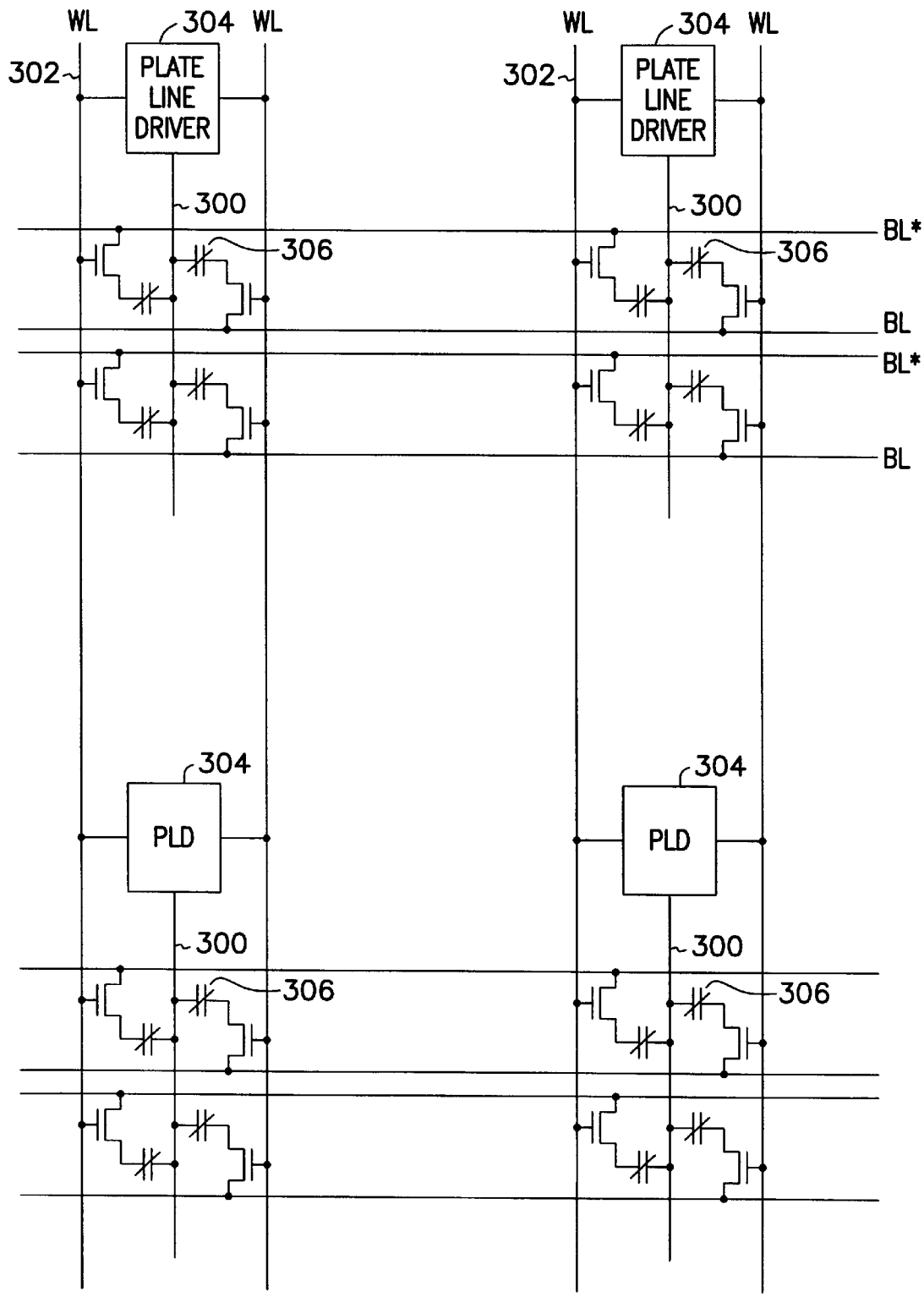
FIG. 13 is a schematic diagram of a segmented plate line having with a driver.

It is contemplated that the segmented plate lines can be driven by a single plate line driver per segment, as shown in FIG. 13. The driver is directly coupled to the plate line and can be located in any position along the segment.

The plate line drivers are illustrated as being coupled to the word line of the memory array. This optional connection allows the driver circuits to be activated, or enabled, in a manner which is responsive to the row without extensive decoder circuitry. In one embodiment, the row of memory cells can contain 512 memory cells 306. The row has two plate line segments 300 associated with it. Each plate line, therefore, is coupled to 256 memory cells. Further, a row of 1024 memory cells can be coupled to eight plate lines having 128 memory cells associated therewith. As stated above, each plate line section can have multiple driver circuits.

Figure 14:
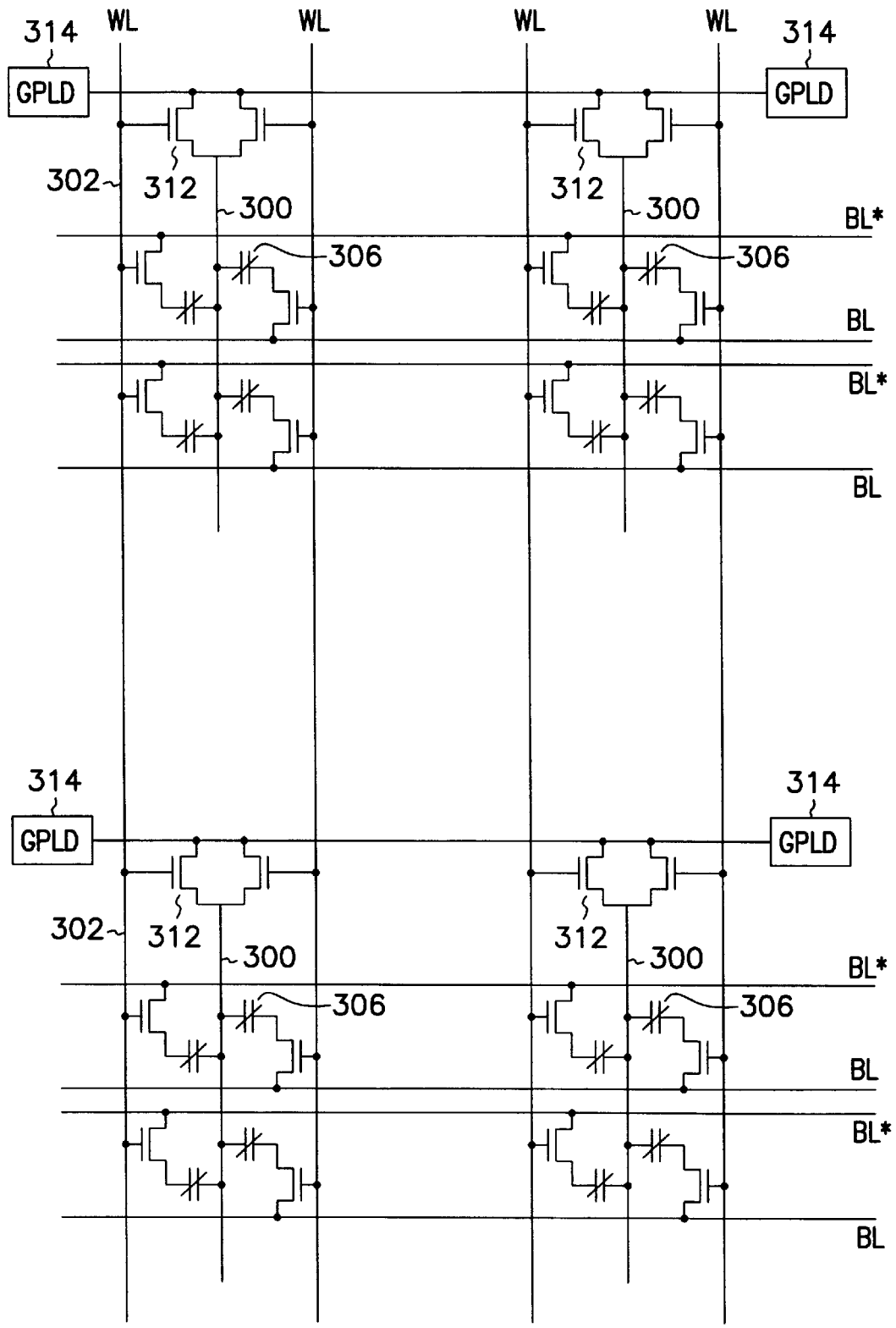
FIG. 14 is a schematic diagram of a global plate line having multiple drivers.

In another embodiment, FIG. 14, a global plate line 310 is provided which is coupled to the plate line sections 300 through access transistors 312. The access transistors can be activated using the wordline signal for the memory row. Additional decoder circuitry, therefore, is eliminated. The global plate line is coupled to multiple global plate line driver circuits 314. Again, the multiple driver circuits can be located in any position along the length of the global plate line. By using multiple plate line drivers, the size of each driver can be reduced and the speed of response of the plate line increased. That is, the voltage of the plate line can be pulsed more rapidly using multiple driver circuits. The segmented cell plate configurations illustrated in FIGS. 11–14 can be operated as either a clocked or pulsed plate line, as described with reference to FIGS. 4 and 5.

CONCLUSION

A ferroelectric memory has been described which has a memory array arranged in rows and columns. The memory array includes a plate line which is segmented. The segmented plate line corresponds to a row of the memory and has multiple driver circuits coupled thereto for providing a plate line voltage signal. Alternatively, the memory array can include a global plate line coupled to the segments of the segmented plate line via an access switch, or transistor. A global plate line voltage is controlled by multiple plate line driver circuits.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A memory device comprising:
   an array of ferroelectric memory cells arranged in rows and columns, the memory cells having a first plate and a second plate;
   a plurality of plate line segments corresponding to each row of the array, the plate line segments coupled to the second plate of the memory cells; and
   a plurality of plate line driver circuits coupled to each one of the plate line segments, wherein the plurality of plate line driver circuits are located at opposite ends of each one of the plurality of plate line segments.

2. The memory device of claim 1 wherein the plurality of plate line driver circuits are coupled to a memory array wordline for enabling the plate line driver circuits.

3. The memory device of claim 1 wherein a row of the memory array comprises 512 memory cells and the plurality of plate line segments comprise two plate line segments coupled to 256 memory cells.

4. The memory device of claim 1 further comprising reference circuitry having a non-remnant capacitor circuit for providing a reference voltage, the non-remnant capacitor circuit comprises a conductor line having a line capacitance, and a plurality of capacitors selectively coupled to the conductor line via access devices.

5. The memory device of claim 1 further comprising:
   a sense amplifier to sense and amplify data stored on the ferroelectric memory cells;
   a pair of bit line sections coupled to the sense amplifier and ferroelectric memory cells; and
   a reference circuit coupled to the pair of bit line sections and having a plurality of ferroelectric reference cells for providing a first reference voltage.

6. A memory device comprising:
   an array of ferroelectric memory cells arranged in rows defined by wordlines and columns defined by bit lines;
   the memory cells having a first plate coupled to a bit line through an access transistor, the access transistor having a gate couple to a wordline for selective activation;
   a plurality of cell plate segments corresponding to the wordlines, and coupled to a second plate of the memory cells;
   a global plate line coupled to the plurality of cell plate segments through coupling transistors; and
   a plurality of global plate line drivers coupled to the global plate line for providing plate line signals.

7. The memory device of claim 6 wherein a gate of the coupling transistors is coupled to wordline for selective activation.

8. The memory device of claim 6 wherein plurality of cell plate segments provide clocked signals to the array of ferroelectric memory cells.

9. The memory device of claim 6 wherein plurality of cell plate segments provide pulsed signals to the array of ferroelectric memory cells.

10. The memory device of claim 6 wherein the plurality of global plate line drivers are located at opposite ends of the global plate line.

11. The memory device of claim 6 wherein the plurality of global plate line drivers comprise two global plate line drivers circuits.

12. The memory device of claim 6 wherein a row of the memory array comprises 512 memory cells and the plurality of plate line segments comprise two plate line segments coupled to 256 memory cells.

13. A method of operating a ferroelectric memory device, the method comprising the steps of:

provicing an activation signals on a wordline to couple a memory cell to a digitline;

providing a plate line signal on a plurality of plate line segments corresponding to the wordline, the plate line signal being generated using a plurality of plate line driver circuits, wherein the plurality of plate line driver circuits comprise two plate line driver circuits per each one of the plurality of plate line segments; and reading data stored in the memory cell.

14. The method of claim 13 wherein the plate line signal is a pulsed signal having a first pulse to read a memory cell, and a second pulse to restore data to the memory cell.

15. The method of claim 13 wherein the wordline corresponds to 512 memory cells and the plurality of plate line segments comprise two plate line segments coupled to 256 memory cells.

16. The method of claim 13 wherein the plurality of plate line driver circuits comprise two plate line driver circuits per each one of the plurality of plate line segments.

17. The method of claim 13 wherein the plate line signal is coupled to the plurality of plate line segments through a global plate line.

18. The method of claim 17 wherein the global plate line is coupled to the plurality of plate line segments through a plurality of transistors selectively activated by the activation signals on the wordline.

19. A processing system comprising:

a microprocessor coupled to a ferroelectric memory; and the ferroelectric memory comprising:

an array of ferroelectric memory cells arranged in rows and columns, the memory cells having a first plate and a second plate;

a plurality of plate line segments corresponding to each row of the array, the plate line segments coupled to the second plate of the memory cells; and a plurality of plate line driver circuits coupled to each one of the plate line segments, wherein the plurality of plate line driver circuits are located at opposite ends of each one of the plurality of plate line segments.

* * * * *